United States Patent [19]

Moskaluk et al.

[11] Patent Number: 5,465,414
[45] Date of Patent: Nov. 7, 1995

[54] AUTOMATIC DETERMINATION OF THE PRESENCE OF A MICROWAVE SIGNAL AND WHETHER THE SIGNAL IS CW OR PULSED

[75] Inventors: Raymond W. Moskaluk; Nancy W. Nelson, both of San Jose, Calif.

[73] Assignee: Hewlett-Packard Company, Palo Alto, Calif.

[21] Appl. No.: 265,981

[22] Filed: Jun. 27, 1994

Related U.S. Application Data

[63] Continuation of Ser. No. 388,774, Jul. 31, 1989, abandoned.
[51] Int. Cl.$^6$ .............................. H04B 1/26; H04B 17/00; G01R 23/16
[52] U.S. Cl. ........................ 455/313; 455/323; 455/226.1; 455/258; 324/76.27
[58] Field of Search .................................. 455/258, 313, 455/318, 323, 336, 337, 226.1; 333/218; 342/352, 386; 324/77 R, 78 R, 78 D, 79 R, 79 D, 84, 77 CS, 76.12, 76.39, 76.47, 76.41, 76.55, 76.27

[56] References Cited

U.S. PATENT DOCUMENTS

| | | | |
|---|---|---|---|
| 4,581,769 | 4/1986 | Grimsley et al | 455/226.1 |
| 4,817,200 | 3/1989 | Tanbakuchi | 455/334 |

*Primary Examiner*—Reinhard J. Eisenzopf
*Assistant Examiner*—Lee Nguyen

[57] ABSTRACT

A method and apparatus for detecting a high frequency signal by down converting the high frequency signal to an intermediate frequency signal by mixing the high frequency signal with the harmonics of a minimal number of local oscillator frequency signals chosen so that at least one harmonic of at least one of the local oscillator frequency signals will convert any high frequency signal in a given frequency range to an intermediate signal in another given frequency range, and applying the result to detectors sensitive to signals in the intermediate frequency range.

14 Claims, 3 Drawing Sheets

AUTOMATIC DETERMINATION OF THE PRESENCE OF A MICROWAVE SIGNAL AND WHETHER THE SIGNAL IS CW OR PULSED

CROSS REFERENCE TO RELATED APPLICATION

This is a continuation of application Ser. No. 07/388,774 filed on Jul. 31, 1989, now abandoned.

FIELD OF THE INVENTION

The invention relates to automatic detection of microwave signals using an intermediate frequency (IF) detector. The invention is particularly applicable for signal detection in microwave counters that can accept either pulsed or CW (continuous wave) microwave input signals.

BACKGROUND OF THE INVENTION

Detection of a microwave signal is traditionally done with a detector that operates at microwave frequencies. These detectors are expensive, because of the high frequency components, e.g., diodes required.

In many types of microwave signal measurement instruments, the microwave input signal is down converted to a lower frequency signal called an intermediate frequency (IF) signal, before the measurement is made. One way this down conversion is done is by harmonically mixing a local oscillator signal (LO) with the microwave input signal. Generally, to down convert the desired microwave signal frequency range into a usable IF range, many LO frequencies must be used. Typically, for a microwave signal range of 500 MHx to 20 GHz, 40 LO frequencies might be used.

In this type of instrument, signal detection can be done on the IF signal rather than on the microwave signal. However, with multiple LO frequencies, the IF signal is not always present when the microwave signal is present. For repetitive pulsed or persistent CW microwave signals, the conventional method of signal detection was to step through each of the available LO signals while monitoring the IF detector. With a large number of LO frequencies, e.g., 40, this procedure takes a relatively long time.

Another type of microwave measurement instrument uses a preselector filter, for example a YIG filter, to limit the bandwidth of the microwave input signal prior to harmonic mixing. In this type of instrument, the frequency band of the filter is stepped through the microwave frequency range while monitoring the IF detector. This procedure takes an even longer time for signal detection, because of the large ratio of the microwave frequency range to the filter frequency range. For a microwave signal range of 500 MHx to 20 GHz, with a filter bandwidth of 100 MHz, almost 200 steps are required.

The long signal acquisition times for the types of detectors described above add significantly to the time required for making repeated automatic measurements. For automated test equipment systems, it would be desirable to reduce the signal acquisition times.

SUMMARY OF THE INVENTION

The invention is a method and apparatus for detecting a high frequency signal by down convening the high frequency signal to an intermediate frequency signal by mixing the high frequency signal with the harmonics of a minimal number of local oscillator frequency signals chosen so that at least one harmonic of at least one of the local oscillator frequency signals will convert any high frequency signal in a given frequency range to an intermediate signal in another given frequency range, and applying the result to detectors sensitive to signals in the intermediate frequency range.

According to the invention, a small number of properly selected LO frequencies can down convert signals over the entire microwave frequency range. One aspect of the invention is the method of selecting the LO frequencies to be used. Another aspect of the invention is the process of using the LO frequency signals selected with the two intermediate frequency detectors for signal detection.

A particular embodiment of the invention uses two IF detectors to determine if a microwave signal is present, and whether it is a pulsed or CW signal. The input microwave signal is down converted to an IF signal using, for example, harmonic heterodyne down conversion. Employing the technique of the invention, with a small number of selected LO frequencies, signals over the entire microwave input range are down converted within the IF range. For example, to down convert microwave input signals in the range of 0.5 to 20 GHz to an IF range of 20 to 140 MHz, only five LO frequencies are required. Thus, signal acquisition requires checking only five LO frequencies rather than the entire set of available LO frequencies.

DETAILED DESCRIPTION OF THE INVENTION

Figure 1:
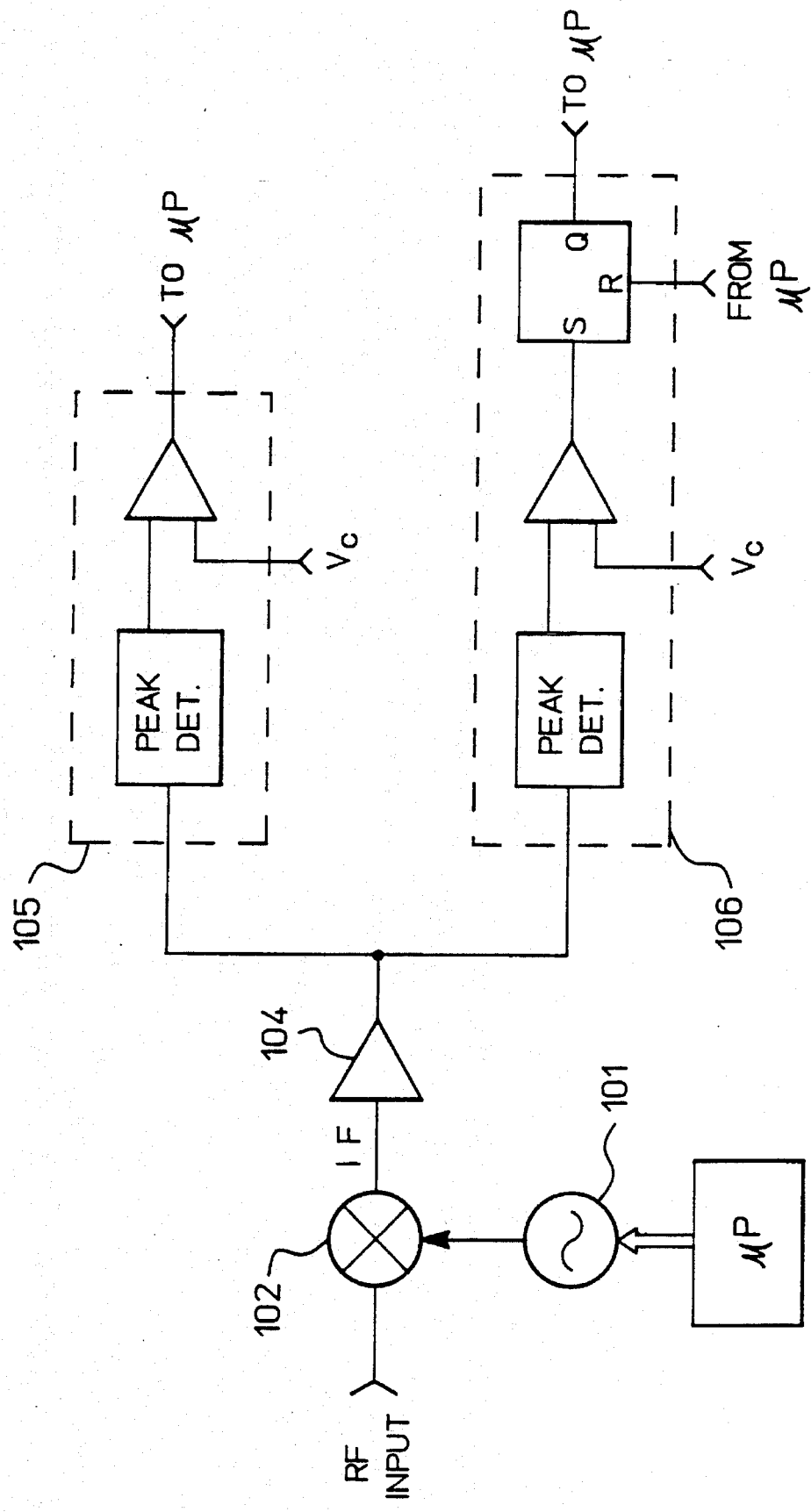
FIG. 1 is a simplified block diagram of the microwave signal detector of the invention.

In a preferred embodiment of the signal detector of the invention, harmonic heterodyne down conversion is used to convert the input microwave signal to an IF signal. The input microwave signal and a lower frequency signal from local oscillator 101 are applied to harmonic mixer 102. The frequency of the LO signal is set by a control signal from microprocessor 103. One or more of the harmonics of the LO signal combines with the microwave signal in harmonic mixer 102 to produce an intermediate frequency (IF) signal output. The relationship between the frequencies of the input signal $f_x$, the LO signal $f_{LO}$, and the IF signal $f_{IF}$, for mixing with at the Nth harmonic of the LO is:

$$f_x = Nf_{LO} +/- f_{IF} \tag{1}$$

The IF output is amplified and conditioned by an IF amplifier 104, then applied to two IF signal detectors 105 and 106.

Detector 105 senses if there is a signal present. This detector can be implemented in a variety of well known ways, for example, a peak detector followed by a comparator. Detector 106 senses if the signal is pulsed or CW. This detector can also be implemented in a variety of well known ways, for example with an envelope detector, e.g., a peak detector with a relatively short time constant, followed by a comparator and a logic circuit. The outputs from detectors 105 and 106 are sent to microprocessor 103.

Detectors 105 and 106 are capable of sensing signals only within a limited IF bandwidth. That is, depending on where in the microwave input frequency range the input signal is located, an appropriate LO signal must be selected for the input signal to be down converted within the IF range of the detectors. The problem, of course, is that the frequency of the input signal is not known.

LO Frequency Selection

Based on an analysis of how the IF range is mapped onto the microwave range by the harmonics of the LO frequencies, a set of LO frequencies can be selected such that at least one LO frequency will down convert any microwave input signal in the microwave range into the IF range.

Figure 2:
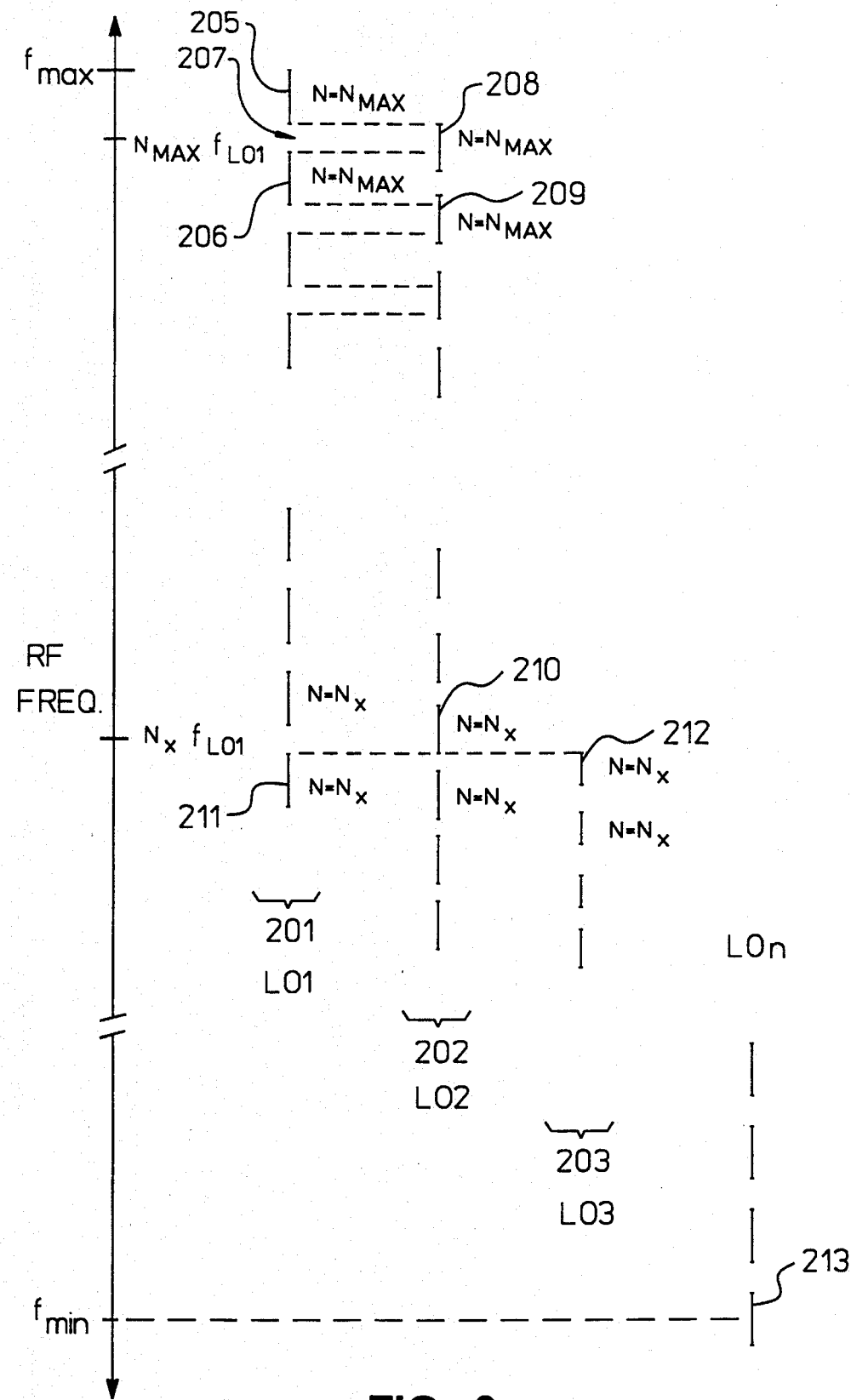
FIG. 2 is a diagram illustrating the selection of the LO frequencies so harmonics down convert microwave input signals over the entire input frequency range to within the IF range.

FIG. 2 illustrates graphically how the LO frequency selection proceeds. The vertical axis of FIG. 2 represents the microwave frequency range, with the highest frequency at the top. The three vertical columns 201, 202 and 203 graphically represent the microwave frequencies down converted within the IF range by three LO frequencies. As will be explained below, these three LO frequencies are chosen so the bands of microwave frequencies converted to the IF range overlap, i.e., no microwave frequencies are uncovered.

The first LO frequency, $f_{LO1}$, is chosen so that the maximum microwave frequency, $f_{MAX}$, is down converted within the top of the IF range at some high harmonic:

$$f_{MAX} - N_{MAX} f_{LO1} \leq f_{IFmax} \tag{2}$$

The microwave frequencies covered by the $N_{MAX}$ harmonic of the first LO are shown by the two side bands 205 and 206. The upper side band 205 and the lower side band 206 are centered around the frequency $N_{MAX} f_{LO1}$, and are separated by an uncovered region 207 that is $2IF_{MIN}$ wide.

The second LO frequency, $f_{LO2}$, is chosen so that, at the same harmonic $N_{MAX}$, the microwave frequency down converted to the top of the IF range is just above the top of the uncovered region 207, and just overlaps the bottom of the lower side band 206. These relationships can be expressed as:

$$N_{MAX} f_{LO1} + f_{IFmin} \leq N_{MAX} f_{LO2} + f_{IFmax} \tag{3a}$$

$$N_{MAX} f_{LO1} - f_{IFmin} \geq N_{MAX} f_{LO2} + f_{IFmin} \tag{3b}$$

Solving equation 3a for $f_{LO2}$ gives the second LO frequency. The result should be checked in equation 3b also to assure that the top side band 208 for the second LO covers region 207.

The bottom side band 209 of the second LO frequency must also cover the gap between the lower side band 206 of the $N_{MAX}$ harmonic and the upper side band 210 of the next lower harmonic of the first LO frequency. This can be expressed as:

$$N_{MAX} f_{LO1} - f_{IFmax} \leq N_{MAX} f_{LO2} - f_{IFmin} \tag{3c}$$

$$(N_{MAX} - 1) f_{LO1} + f_{IFmax} \geq N_{MAX} f_{LO2} - f_{IFmax} \tag{3d}$$

When rearrange, equation 3c is the same relationship as equation 3a, so it is already satisfied. The LO frequencies need to be checked to be certain they satisfy, equation 3d.

In general, the relationships for two LO frequencies can be stated as:

$$N f_{LOn} + f_{IFmin} \leq N f_{LOn+1} + f_{IFmax} \tag{3e}$$

$$N f_{LOn} - f_{IFmin} \geq N F_{LOn+1} + f_{IFmin} \tag{3f}$$

The next question to answer is when another LO frequency will be needed. At some lower harmonic $N_X$, because $f_{LO2}$ is smaller than $f_{LO1}$, the bottom of the upper side band 210 for the second LO will equal the top of the lower side band 211 of the first LO. This situation is graphically shown in the middle section of FIG. 2. At this point, another gap will start, unless a third LO frequency is added to cover the gap. The relationship at this point can be expressed as:

$$N_X f_{LO1} - f_{IFmin} = N_X f_{LO2} + f_{IFmin} \tag{4}$$

Solving for $N_X$ allows the next, i.e., third LO frequency to be determined, similar to the way the second LO frequency was determined:

$$N_X f_{LO2} + f_{IFmin} \geq N_X f_{LO3} + f_{IFmax} \tag{5}$$

Solving for $f_{LO3}$ gives the third LO frequency. Again, the result is that, at this harmonic number, the third LO upper side band 212 covers the gap left by the side bands from the first and second LO frequencies.

This process can be repeated until the lower end of the microwave frequency range is reached, or until the lowest usable harmonic is reached. If the lowest harmonic is reached first, either the IF range or the LO range must be increased, and the LO selection process repeated, if the desired microwave input range is to be covered. If the coverage for the last chosen LO frequency $f_{LOn}$ extends to the lower end of the microwave range $f_{MIN}$ before the minimum harmonic number $N_{MIN}$ is reached, the relationship can be expressed as:

$$N_{MIN} f_{LOn} - f_{IFmax} \leq f_{MIN} \tag{6}$$

This situation is graphically shown in the lower right corner of FIG. 2, where the lower side band 213 of the final LO reaches the low end of the microwave frequency range.

The process of selecting the LO frequencies could also be started at the lower end of the microwave frequency range, moving to higher LO and microwave frequencies and higher harmonic numbers. The set of equations for determining the LO frequencies and harmonic numbers for this set of frequencies can be derived similarly to the way the equations for proceeding from the top of the microwave range down were derived.

An example will further explain the process for selecting the set of LO frequencies. For a microwave frequency range of 0.5 to 20 GHz, and an IF range of 20 to 140 MHz, to obtain a first LO frequency around 350 MHz requires a harmonic number $N_{MAX}$ of 83. To check that setting $f_{LO1}$ to 350 MHZ works, solve equation 2 for $f_{LO1}$:

$$f_{LO1} \geq (1/N_{MAX})(f_{MAX} - F_{IFmax}) \tag{7}$$
$$350e6 \geq (1/83)(20e9 - 140e6)$$
$$350e6 \geq 239.3e6$$

To select the second LO frequency, we solve equation 3 for $f_{LO2}$, substituting the known values for $N_{MAX}$=83 $f_{IFmin}$=20 MHx, $f_{IFmax}$=175 MHz, and $f_{LO1}$ =350 MHz:

$$f_{LO2} \geq (1/N_{MAX})(N_{MAX} f_{LO1} + f_{IFmin} - f_{IFmax}) \tag{8}$$
$$f_{LO2} \geq (1/83)[(83)(350e6) + 20e6 - 140e6]$$
$$f_{LO2} \geq 348.55e6$$

Rounding up to assure coverage set the second LO frequency to 348.6 MHz.

Next, determine the harmonic at which the next LO is needed to prevent a gap, by solving equation 4 for $N_X$ again substituting known quantities:

$$N_X \geq 2 f_{IFmin}/(f_{LO1} - f_{LO2}) \tag{9}$$

$$N_X \geq 2(20e6)/(350e6 - 346.8e6)$$

$N_x \geq 28.57$

Since N must be an integer, round up to assure coverage, and use $N_x=29$.

The third LO frequency can be determined by using this harmonic and $f_{LO2}$ similarly as done in equation 8:

$$f_{LO3} \geq (1/N_x)(N_x f_{LO2} + f_{IFmin} - f_{IFmax}) \quad (10)$$

$$f_{LO3} \geq (1/29)(29)(348.6e6) + 20e6 - 140e6]$$

Solving and rounding up, the third LO frequency, $f_{LO3}$ is set to 344.7 MHz.

Repeating the process in a similar function for the next LO frequency, substituting in equation 9, the harmonic number at which a fourth LO is needed is N=11, and substituting in equation 10, the fourth LO frequency is $f_{LO4}$=333.8 MHz.

Again repeating the process, the harmonic number at which a fifth LO is needed is N=4, and the fifth LO frequency is $f_{LO6}$=303.8 MHz.

The next LO frequency would be needed at a harmonic number of 1.33. However, the side bands of the fifth LO frequency extend below the minimum RF frequency at harmonic number of 2. This can be shown with equation 6:

$$N_{MIN} f_{LOn} - f_{IFmax} \geq f_{MIN} \quad (6)$$
$$2(303.8e6) - 140e6 \geq 500e6$$
$$467.6e6 \geq 500e6$$

Thus coverage with the fifth LO frequency extends down to 467.6 MHz, which is below the minimum RF frequency of 500 MHz.

For this example, signal detection can be done using the five LO frequencies selected: 350 MHz, 348.6 MHz, 344.7 MHz, 333.8 MHz and 303.8 MHz.

Operation for Signal Detection

Figure 3:
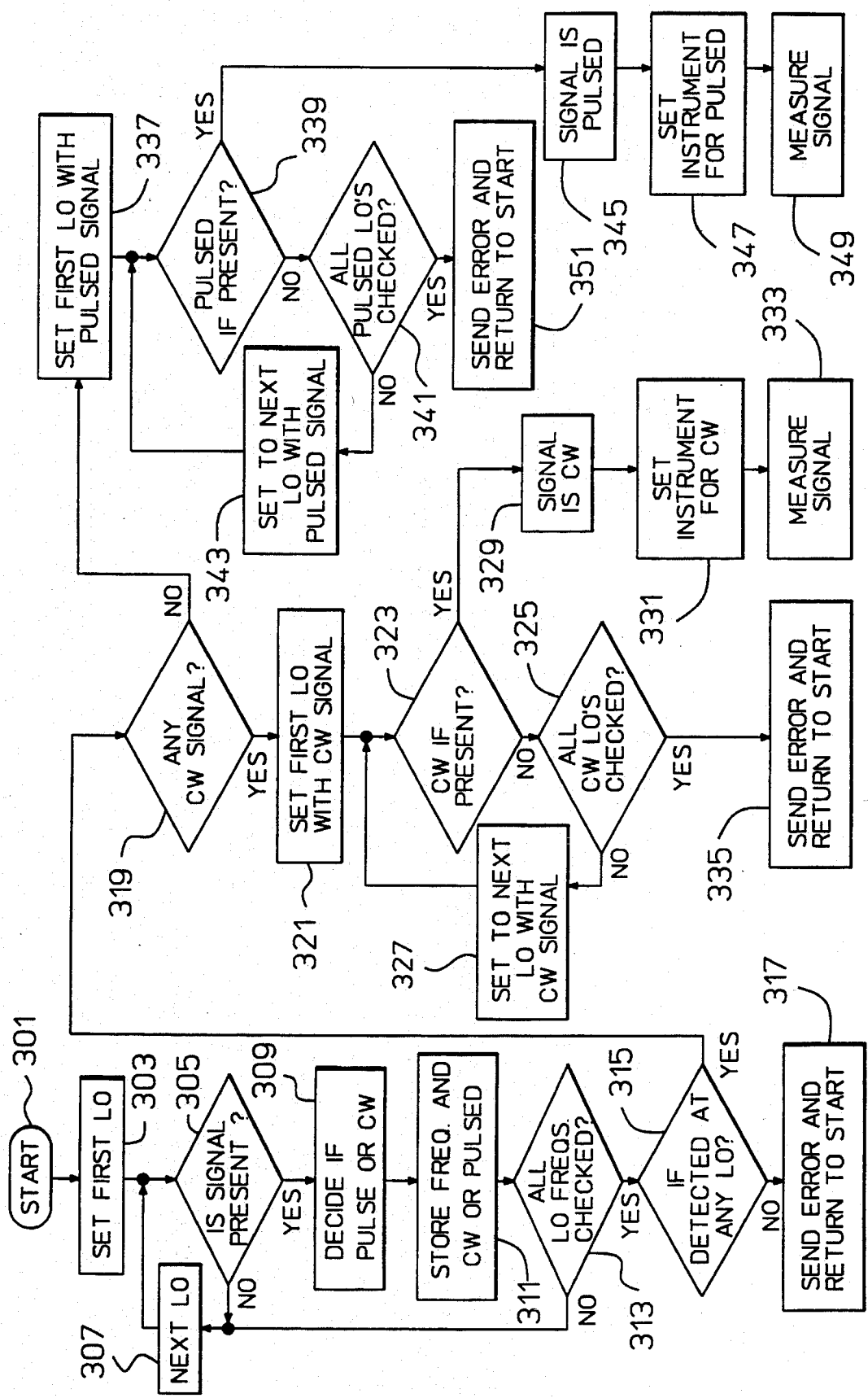
FIG. 3 is a flow chart of the process followed by the signal detector to determine is a signal is present and whether the signal is pulsed or CW.

The flow chart of FIG. 3 shows the detection procedure. The procedure determines whether an RF signal is present, then if a signal is found, determines whether it is a pulsed or CW signal. When a signal is found, the measurement instrument is set to the correct rondo of operation and a measurement is taken.

The process starts at block 301. In blocks 303 to 311, the LO frequencies are checked sequentially until an IF signal is detected. The local oscillator is set to the first LO frequency at block 303 and the detector 105 is checked for an IF signal in decision block 305. If no IF signal is detected, the next LO frequency is selected at block 307 and the detector is checked again. If an IF signal is detected, at block 309 detector 106 is checked to determine if the signal is Pulsed or CW, and the LO frequency and the nature of the signal is stored at block 311. At decision block 313, if not all the IF frequencies have been checked, the local oscillator is set to the next LO frequency and control flows again to block 305. If all the IF frequencies have been checked, control passes to decision block 315. Form block 315, if no IF signal was detected at any LO frequency, at block 317 an error message is sent, and control passes back to star block 301. If an IF signal was detected, control passes from block 315 to decision block 319.

After the first detection of a signal, a second check is made at the LO frequencies at which signals were detected, to confirm the existence and nature of the signal. This is necessary because, for example, the IF detectors behave differently for RF signals mixed with different harmonics of LO signals, because the IF falls at the edge of the detector's range, or because of variability in the RF input signal. Because the harmonics of the various LO frequencies overlap, several LO frequencies may produce a detected IF signal.

If any of the IF signals detected and stored is a CW signal, decision block 319 passes control to blocks 321 to 335, in which either the CW nature is confirmed, or an error is found and the process started again. If none of the signals detected is CW, decision block 319 passes control to blocks 337 to 351, in which either the pulsed nature is confirmed, or an error is found and the process started again.

At block 321 the local oscillator is set to the first LO frequency that produced a CW IF signal. At block 323, detector 106 is checked for a CW signal present. If no CW signal is found, and not all the LO frequencies that produced CW IF signals have been checked, as determined at decision block 325, the local oscillator is set to the next LO that produced a CW IF signal, at block 327, and control returns to block 323. If no CW signal is found, and all the LO frequencies that produced CW IF signals have been checked, at block 335 an error message is sent and control returns to the start an block 301.

If a CW signal is detected at block 323, the signal is confirmed as CW at block 329. Control passes to block 331 so the measurement instrument is set for CW mode and a measurement is taken at block 333.

If only pulses signals were detected, a similar confirmation procedure is followed in blocks 335 to 351. At block 335 the local oscillator is set to the first LO frequency that produced a pulsed IF signal. At block 337, detector 1 06 is checked for a pulsed signal present. If no pulsed signal is found, and not all the LO frequencies that produced pulsed IF signals have been checked, as determined at decision block 341, the local oscillator is set to the next LO that produced a pulsed IF signal, at block 343, and control returns to block 339. If no pulsed signal is found, and all the LO frequencies that produced pulsed IF signals have been checked, an error message is sent at block 351 and control returns to the start an block 301.

If a pulsed signal is detected at block 339, the signal is confirmed as pulsed at block 345. Control passes to block 347 so the measurement instrument is set for pulsed mode and a measurement is taken at block 349.

A device and method are thus provided which detect the presence of a microwave signal and determine whether the signal is pulsed or CW, using IF detectors and a small number of LO frequencies.

While specific hardware components are shown in FIG. 1 for implementing the invention, such components are not a limitation on the invention and the invention may be practiced utilizing other suitable hardware, or a combination of hardware and software. Thus, while the invention has been shown and described with respect to a preferred embodiment, the foregoing and other changes in form and detail may be made therein by one skilled in the art without departing from the spirit and scope of the invention.

We claim:

1. A method of down converting a high frequency signal within a first frequency range to a first lower frequency signal in a second frequency range by mixing the high frequency signal with harmonics of a minimal number of second lower frequency signals within a third frequency range, the second lower frequency signals having second frequencies and chosen so that some harmonic of at least one of the second lower frequency signals will convert any signal in the first frequency range to a signal in the second frequency range, wherein, the high frequency signal includes maximum and minimum frequencies;

the first lower frequency signal is an intermediate frequency signal and includes maximum and minimum intermediate frequencies; the second lower frequency signal is a local oscillator signal and includes first and succeeding local oscillator frequencies;

the harmonics include a selected harmonic number, a lowest integer harmonic number, and a minimum allowable harmonic number;

the first local oscillator frequency is selected according to the relationship:

$$f_{MAX} = N_{MAX} f_{LO1} \leq f_{IFmax}$$

where $f_{MAX}$ is the maximum frequency, $N_{MAX}$ is the selected harmonic number, $f_{IFmax}$ is the maximum intermediate frequency, and $f_{LO1}$ is the first local oscillator frequency;

succeeding local oscillator frequencies are chosen to satisfy the following relationships:

$$Nf_{LOn} + f_{IFmin} \leq Nf_{LOn+1} + f_{IFmax}$$
$$NF_{LOn} - f_{IFmin} \geq NF_{LOn+1} + f_{IFmin}$$
$$(N-1)f_{LOn} + f_{IFmax} \geq Nf_{LOn+1} - f_{IFmax}$$

where $f_{IFmin}$ is the minimum intermediate frequency, and N is the lowest integer harmonic number at which:

$$N \geq 2f_{IFmin}/(f_{LOn} - f_{LOn+1});$$

proceeding to select additional local oscillator frequencies until a last selected frequency, $f_{LOn}$, satisfies the relationship:

$$N_{MIN} f_{LOn} - f_{IFmax} \leq f_{MIN}$$

where $f_{MIN}$ is the minimum frequency and $N_{MIN}$ is the minimum allowable harmonic number.

2. The method of claim 1 wherein the high frequency signal is a microwave signal.

3. The method of claim 2 wherein the mixing is harmonic heterodyne conversion.

4. A method of down converting a high frequency signal within a first frequency range to a first lower frequency signal in a second frequency range by mixing the high frequency signal with harmonics of a minimal number of second lower frequency signals within a third frequency range, the second lower frequency signals having second frequencies and chosen so that some harmonic of at least one of the second lower frequency signals will convert any signal in the first frequency range to a signal in the second frequency range, wherein, the high frequency signal includes maximum and minimum frequencies;

the first lower frequency signal is an intermediate frequency signal and includes maximum and minimum intermediate frequencies; the second lower frequency signal is a local oscillator signal and includes first and succeeding local oscillator frequencies:

the harmonics include a selected harmonic number a lowest integer harmonic number, and a minimum allowable harmonic number;

the first local oscillator frequency is selected according to the relationship:

$$N_{MIN} f_{LO1} - f_{IFmax} \leq f_{MIN}$$

where $f_{MIN}$ is the minimum frequency, $N_{MIN}$ is the selected harmonic number, $f_{IFmax}$ is the maximum intermediate frequency, and $f_{LO1}$ is the first local oscillator frequency;

succeeding local oscillator frequencies are chosen to satisfy the following relationships:

$$Nf_{LOn} - f_{IFmin} \geq Nf_{LOn+1} - f_{IFmax}$$
$$Nf_{LOn} + f_{IFmin}\ Nf_{LOn+1} - f_{IFmin}$$
$$(N+1)f_{LOn} - f_{IFmax} \leq Nf_{LOn+1} + f_{IFmax}$$

where $f_{IFmin}$ is the minimum intermediate frequency, and N is the lowest integer harmonic number at which:

$$N \geq 2f_{IFmin}/(f_{LOn+1} - f_{LOn});$$

proceeding to select additional local oscillator frequencies until a last selected frequency, $f_{LOn}$, satisfies the relationship:

$$f_{MAX} - N_{max} f_{LOn} \leq f_{IFmax}$$

where $f_{MAX}$ is the microwave frequency and $N_{MAX}$ is the maximum allowable harmonic number.

5. The method of claim 4 wherein the high frequency signal is a microwave signal.

6. The method of claim 5 wherein the mixing is harmonic heterodyne conversion.

7. A method of wideband signal detection of pulsed or continuous wave microwave input signals in a predetermined microwave frequency range, without using a microwave signal detector, comprising;

selecting a small number of discrete frequencies from an operating range of local oscillator frequencies, so that some harmonic of at least one of a small number of local oscillator frequencies will convert any signal in the microwave frequency range to a signal within an intermediate frequency range, wherein;

the microwave frequency range includes maximum and minimum microwave frequencies;

the local oscillator frequencies include first and succeeding local oscillator frequencies;

the intermediate frequency range includes maximum and minimum intermediate frequencies;

the harmonics include a selected harmonic number, a lowest integer harmonic number, and a minimum allowable harmonic number;

mixing each of the selected local oscillator frequencies sequentially with the microwave input signal; and applying the signal produced by mixing to a first detector sensitive to intermediate frequency signals to determine whether an intermediate frequency signal is produced;

applying the signal produced by mixing to a second detector sensitive to intermediate frequency signals to determine whether the intermediate frequency signal is pulsed or continuous wave;

the first local oscillator frequency is selected according to the relationship:

$$f_{MAX} - N_{MAX} f_{LO1} \leq f_{IFmax}$$

where $f_{MAX}$ is the maximum microwave frequency, $N_{MAX}$ is the selected harmonic number, $f_{IFmax}$ is the maximum intermediate frequency, and $f_{LO1}$ the first local oscillator frequency;

succeeding local oscillator frequencies are chosen to satisfy the following relationships:

$$Nf_{LOn} + f_{IFmin} \leq Nf_{LOn+1} + f_{IFmax}$$
$$NF_{LOn} - f_{IFmin} \geq NF_{LOn+1} + f_{IFmin}$$
$$(N - 1)f_{LOn} + f_{IFmax} \geq Nf_{LOn+1} - f_{IFmax}$$

where $f_{IFmin}$ is the minimum intermediate frequency, and N is the lowest integer harmonic number at which:

$$N \geq 2f_{IFmin}/(f_{LOn} - f_{LOn+1});$$

proceeding to select additional local oscillator frequencies until a last selected frequency, $f_{LOn}$, satisfies the relationship:

$$N_{MIN} f_{LOn} - f_{IFmax} \leq f_{MIN}$$

where $f_{MIN}$ is the minimum microwave frequency and $N_{MIN}$ is the minimum allowable harmonic number.

8. The method of claim 7 wherein the microwave frequency range is 500 MHz to 20 GHz, the intermediate frequency range is 20 MHz to 140 MHz, the discrete local oscillator frequencies are in a frequency range between 250 MHz to 350 MHz, and the number of local oscillator frequencies selected is five.

9. A method of wide-band signal detection of pulsed or continuous wave microwave input signals in a predetermined microwave frequency range, without using a microwave signal detector, comprising:

selecting a small number of discrete frequencies from an operating range of local oscillator frequencies, so that some harmonic of at least one of a small number of local oscillator frequencies will convert any signal in the microwave frequency range to a signal within an intermediate frequency range, wherein;

the microwave frequency range includes maximum and minimum microwave frequencies;

the local oscillator frequencies include first and succeeding local oscillator frequencies;

the intermediate frequency range includes maximum and minimum intermediate frequencies;

the harmonics include a selected harmonic number, a lowest integer harmonic number and a minimum allowable harmonic number;

mixing each of the selected local oscillator frequencies sequentially with the microwave input signal; and applying the signal produced by mixing to a first detector sensitive to intermediate frequency signals to determine whether an intermediate frequency signal is produced;

applying the signal produced by mixing to a second detector sensitive to intermediate frequency signals to determine whether the intermediate frequency signal is pulsed or continuous wave;

the first local oscillator frequency is selected according to the relationship:

$$N_{MIN} f_{LO1} - f_{IFmax} \leq f_{MIN}$$

where $f_{MIN}$ is the minimum microwave frequency, $N_{MIN}$ is the selected harmonic number, $f_{IFmax}$ is the maximum intermediate frequency, and $f_{LO1}$ is the first local oscillator frequency;

succeeding local oscillator frequencies are chosen to satisfy the following relationships:

$$Nf_{LOn} - f_{IFmin} \geq Nf_{LOn+1} - f_{IFmax}$$
$$NF_{LOn} + f_{IFmin} \, NF_{LOn+1} - f_{IFmin}$$
$$(N + 1)f_{LOn} - f_{IFmax} \geq Nf_{LOn+1} + f_{IFmax}$$

where $f_{IFmin}$ is the minimum intermediate frequency, and N is the lowest integer harmonic number at which:

$$N \geq 2f_{IFmin}/(f_{LOn+1} - f_{LOn});$$

proceeding to select additional local oscillator frequencies until a last selected frequency, $f_{LOn}$, satisfies the relationship:

$$f_{MAX} - N_{max} f_{LOn} \leq f_{IFmax}$$

where $f_{MAX}$ is the maximum microwave frequency and $N_{MAX}$ is the maximum allowable harmonic number.

10. The method of claim 9 wherein the microwave frequency range is 500 MHz to 20 GHz, the intermediate frequency range is 20 MHz to 140 MHz, the discrete local oscillator frequencies are in a frequency range between 250 MHz to 350 MHz, and the number of local oscillator frequencies selected is five.

11. Apparatus for wide-band signal detection of pulsed or continuous wave high frequency input signals in a predetermined high frequency range, without using a high signal detector, comprising:

means for generating a frequency for a local oscillator, programmed to sequentially generate a number of discrete local oscillator frequencies from a set selected so that at least one harmonic of at least one of the local oscillator frequencies will convert any signal in the predetermined high frequency range to a signal within an intermediate frequency range; wherein the set of local oscillator frequencies is an operating range for the local oscillator;

means for mixing each of the local oscillator frequencies with the high frequency input signal to produce an output signal;

first detector means responsive to the output signal, and sensitive to intermediate frequency signals, to determine whether the output signal is an intermediate frequency signal; and second detector means responsive to the output signal, and sensitive to intermediate frequency signals, to determine whether the output signal is pulsed or continuous wave; wherein the high frequency range includes maximum and minimum high frequencies;

the local oscillator frequencies include first and succeeding local oscillator frequencies;

the intermediate frequency range includes maximum and minimum intermediate frequencies;

the harmonics include a selected harmonic number, a lowest integer harmonic number, and a minimum allowable harmonic number;

the first local oscillator frequency is selected according to the relationship:

$$f_{MAX} - N_{MAX} f_{LO1} \leq f_{IFmax}$$

where $f_{MAX}$ is the maximum high frequency, $N_{MAX}$ is the selected harmonic number, $f_{IFmax}$ is the maximum intermediate frequency, and $f_{LO1}$ the first local oscillator frequency;

succeeding local oscillator frequencies are chosen to satisfy the following relationships:

$$Nf_{LOn} + f_{IFmin} \leq Nf_{LOn+1} + f_{IFmax}$$
$$NF_{LOn} - f_{IFmin} \geq NF_{LOn+1} + f_{IFmin}$$
$$(N-1)f_{LOn} + f_{IFmax} \geq Nf_{LOn+1} - f_{IFmax}$$

where $f_{IFmin}$ is the minimum intermediate frequency, and N is the lowest integer harmonic number at which:

$$N \geq 2f_{IFmin}/(f_{LOn} - f_{LOn+1});$$

proceeding to select additional local oscillator frequencies until a last selected frequency, $f_{LOn}$, satisfies the relationship:

$$N_{min}f_{LOn} - f_{IFmax} \leq f_{MIN}$$

where $f_{MIN}$ is the minimum high frequency and $N_{MIN}$ is the minimum allowable harmonic number.

12. The apparatus of claim 11 wherein the predetermined high frequency range is 500 MHz to 20 GHz, the intermediate frequency range is 20 MHz to 140 MHz, the local oscillator frequency range is 250 MHz to 350 Mhz, and the number of local oscillator frequencies selected is five.

13. Apparatus for wide-band signal detection of pulsed or continuous wave high input signals in a predetermined high frequency range, without using a high signal detector, comprising:

selecting a small number of discrete frequencies from an operating range of local oscillator frequencies, so that some harmonic of at least one of a small number of local oscillator frequencies will convert any signal in the high frequency range to a signal within an intermediate frequency range wherein;

the high frequency range includes maximum and minimum high frequencies;

the local oscillator frequencies include first and succeeding local oscillator frequencies;

the intermediate frequency range includes maximum and minimum intermediate frequencies;

the harmonics include a selected harmonic number, a lowest integer harmonic number, and a minimum allowable harmonic number;

mixing each of the selected local oscillator frequencies sequentially with the high input signal; and applying the signal produced by mixing to a first detector sensitive to intermediate frequency signals to determine whether an intermediate frequency signal is produced;

applying the signal produced by mixing to a second detector sensitive to intermediate frequency signals to determine whether the intermediate frequency signal is pulsed or continuous wave;

the first local oscillator frequency is selected according to the relationship:

$$N_{MIN}f_{LO1} - f_{IFmax} \leq f_{MIN}$$

where $f_{MIN}$ is the minimum high frequency, $N_{MIN}$ is the selected harmonic number, $f_{IFmax}$ is the maximum intermediate frequency, and $f_{LO1}$ is the first local oscillator frequency;

succeeding local oscillator frequencies are chosen to satisfy the following relationships:

$$Nf_{LOn} - f_{IFmin} \geq Nf_{LOn+1} - f_{IFmax}$$
$$NF_{LOn} + f_{IFmin} NF_{LOn+1} - f_{IFmin}$$
$$(N+1)f_{LOn} - f_{IFmax} \geq Nf_{LOn+1} + f_{IFmax}$$

where $f_{IFmin}$ is the minimum intermediate frequency, and N is the lowest integer harmonic number at which:

$$N \geq 2f_{IFmin}/(f_{LOn+1} - f_{LOn});$$

proceeding to select additional local oscillator frequencies until a last selected frequency, $f_{LOn}$, satisfies the relationship:

$$f_{MAX} - N_{max}f_{LOn} \leq f_{IFmax}$$

where $f_{MAX}$ is the maximum high frequency and $N_{MAX}$ is the maximum allowable harmonic number.

14. The apparatus of claim 13 wherein the predetermined high frequency range is 500 MHz to 20 GHz, the intermediate frequency range is 20 MHz to 140 MHz, the local oscillator frequency range is 250 MHz to 350 Mhz, and the number of local oscillator frequencies selected is five.

* * * * *